US011296616B2

(12) United States Patent
Veltman (10) Patent No.: US 11,296,616 B2
(45) Date of Patent: Apr. 5, 2022

(54) POWERING MICROCONTROLLERS (71) Applicant: KONINKLIJKE PHILIPS N.V., Eindhoven (NL)

(72) Inventor: Eddy Gerrit Veltman, Steenbergen (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 41 days.

(21) Appl. No.: 16/954,251

(22) PCT Filed: Dec. 18, 2018

(86) PCT No.: PCT/EP2018/085613
§ 371 (c)(1),
(2) Date: Jun. 16, 2020

(87) PCT Pub. No.: WO2019/121755
PCT Pub. Date: Jun. 27, 2019

(65) Prior Publication Data
US 2021/0376755 A1 Dec. 2, 2021

(30) Foreign Application Priority Data

Dec. 19, 2017 (EP) ..................................... 17208321

(51) Int. Cl.
*H02M 7/219* (2006.01)
*B26B 19/38* (2006.01)
(Continued)

(52) U.S. Cl.
CPC ......... *H02M 7/219* (2013.01); *B26B 19/3873* (2013.01); *G01R 19/16538* (2013.01);
(Continued)

(58) Field of Classification Search
CPC .... H02M 7/217; H02M 7/219; B26B 19/3873
See application file for complete search history.

(56) References Cited

U.S. PATENT DOCUMENTS

| | | | | |
|---|---|---|---|---|
| 5,726,873 A | * | 3/1998 | Gold ...................... | H02M 1/08 363/98 |
| 6,087,815 A | * | 7/2000 | Pfeifer ..................... | B25F 5/00 323/282 |

(Continued)

FOREIGN PATENT DOCUMENTS

| | | |
|---|---|---|
| CN | 102545354 | 7/2012 |
| DE | 102015211548 | 12/2016 |

(Continued)

OTHER PUBLICATIONS

International Search Report and Written Opinion dated Mar. 27, 2019 for International Application No. PCT/EP2018/085613 filed Dec. 18, 2018.

*Primary Examiner* — Gary A Nash (57) ABSTRACT

This application relates to methods and apparatus for powering microcontrollers (104), in particular for powering microcontrollers of a personal care product, such as a shaver product (107). The microcontroller is arranged such that a first output port (206-1) of a plurality of output ports of the microcontroller receives, in use, an AC waveform. Each output port has an associated high-side switch (207) electrically connected between the output port and a high-side DC voltage rail and an associated low-side switch (208) electrically connected between the output port and a low-side DC voltage rail. A processing module (202) of the microcontroller is configured to monitor a phase of the AC waveform and to control switching of the associated high-side and low-side switches of the first output port based on the phase of the AC waveform so as to provide a rectified voltage between the high-side DC voltage rail and the low-side voltage rail for powering the processing module. The processing module (202) also controls switching of the associated switches of at least a further output port to output a control signal for controlling at least one aspect of operation of a host device. The processing module is further configured to maintain the associated high-side switch of the (Continued)

first output port in a turned-off state when a monitored voltage of the AC waveform at the first output port is between zero and a monitored voltage at the high-side DC voltage rail, and to maintain the associated high-side switch of the first output port in a turned-on state when the monitored voltage of the AC waveform at the first output port is greater than the monitored voltage at the high-side DC voltage rail.

15 Claims, 3 Drawing Sheets (51) Int. Cl.
*H02M 7/217* (2006.01)
*H02M 1/088* (2006.01)
*H02M 1/08* (2006.01)
*H02M 1/00* (2006.01)
*G01R 19/165* (2006.01)
*G01R 19/175* (2006.01)

(52) U.S. Cl.
CPC ........ *G01R 19/175* (2013.01); *H02M 1/0003* (2021.05); *H02M 1/0048* (2021.05); *H02M 1/082* (2013.01); *H02M 1/083* (2013.01); *H02M 1/088* (2013.01); *H02M 7/217* (2013.01)

(56) References Cited

U.S. PATENT DOCUMENTS

| | | | |
|---|---|---|---|
| 6,906,500 B2* | 6/2005 | Kernahan | H05B 41/2828 323/225 |
| 7,616,463 B2* | 11/2009 | Burstein | H02M 3/1584 363/72 |
| 8,946,943 B2* | 2/2015 | Petruzzi | H03K 17/0822 307/113 |
| 2007/0058402 A1 | 3/2007 | Shekhawat | |
| 2013/0215657 A1* | 8/2013 | Heath | H02M 1/38 363/127 |
| 2016/0268903 A1 | 9/2016 | Miyaki | |
| 2016/0315553 A1* | 10/2016 | Ishimaru | H02M 7/219 |
| 2016/0336871 A1* | 11/2016 | Aungurencei | H02M 7/219 |
| 2017/0012553 A1 | 1/2017 | De Vita | |
| 2017/0080808 A1 | 3/2017 | Bai | |

FOREIGN PATENT DOCUMENTS

| | | | |
|---|---|---|---|
| DE | 102015211548 A1 * | 12/2016 | ........ H03K 17/165 |
| EP | 2840693 | 2/2015 | |
| JP | H10271829 | 10/1998 | |
| JP | 2017118641 | 6/2017 | |
| WO | 2011006209 | 1/2011 | |

* cited by examiner

(prior art)

POWERING MICROCONTROLLERS

CROSS REFERENCE TO RELATED APPLICATIONS

This application is the U.S. National Phase application under 35 U.S.C. § 371 of International Application No. PCT/EP2018/085613 filed Dec. 18, 2018, published as WO 2019/121755 on Jun. 27, 2019, which claims the benefit of European Patent Application Number 17208321.4 filed Dec. 19, 2017. These applications are hereby incorporated by reference herein.

FIELD OF THE INVENTION

This disclosure relates to powering of microcontrollers, in particular for powering microcontrollers of a personal care product, such as a shaver product.

BACKGROUND OF THE INVENTION

Microcontrollers are relatively small control circuits, typically having at least one processor and some memory and configurable to provide some sensing and/or control functionality via a variety of general purpose input-output (GPIO) ports.

Microcontrollers may be embedded into a variety of electronic products to provide sensing and/or control functionality, for instance to allow operation of the product to be adapted to the prevailing operating conditions.

The microcontroller will need to be powered in use. In some instances however, depending on the location of the microcontroller within the product, providing suitable DC power to the microcontroller from a power source of the product, e.g. from a battery or derived from a mains-supply, may not be straightforward.

Embodiments of the present disclosure are directed to methods and apparatus for powering of microcontrollers.

DE 10 2015 211 548 A1 discloses a device for controlling a bridge rectifier comprising two low-side MOSFET switches controlled by a first control device and comprising two high-side MOSFET switches each controlled by a respective one of two second control devices. The two second control devices are functionally connected to the first control device in such a way that control signals for the two high-side MOSFET switches are deducted from control signals for the two low-side MOSFET switches, whereby each pair of diagonally arranged MOSFET switches are synchroneously switched. In this way an AC voltage provided at a first node point between one of the low-side MOSFET switches and one of the high-side MOSFET switches and at a second node point between the other low-side MOSFET switch and the other high-side MOSFET switch is transformed into a DC voltage. In an embodiment the second control devices are powered by a condensator charged by the DC voltage.

SUMMARY OF THE INVENTION

According to one aspect of the disclosure there is provided a microcontroller apparatus comprising a microcontroller circuit comprising a plurality of output ports. Each output port has an associated high-side switch electrically connected between the output port and a high-side DC voltage rail and an associated low-side switch electrically connected between the output port and a low-side DC voltage rail. The microcontroller apparatus further comprises a processing module configured to be powered, in use, by the high-side DC voltage rail and the low-side DC voltage rail. The microcontroller apparatus further comprises a capacitance electrically connected to the high-side DC voltage rail. At least one output port of the plurality of output ports is configured to output a control signal to control at least one aspect of operation of a host device. The processing module is configured to control switching of the associated high-side switch and low-side switch of the at least one output port so as to output the control signal. The plurality of output ports further comprises a first output port configured to receive, in use, an AC waveform and the processing module is configured to monitor a phase of the AC waveform and to control switching of the associated high-side switch and the associated low-side switch of the first output port based on the phase of the AC waveform so as to provide a rectified voltage between the high-side DC voltage rail and the low-side voltage rail. The processing module is further configured to monitor a voltage of the AC waveform at the first output port and a voltage at the high-side DC voltage rail, maintain the associated high-side switch of the first output port in a turned-off state when the monitored voltage of the AC waveform at the first output port is between zero and the monitored voltage at the high-side DC voltage rail, and maintain the associated high-side switch of the first output port in a turned-on state when the monitored voltage of the AC waveform at the first output port is greater than the monitored voltage at the high-side DC voltage rail.

This arrangement allows a microcontroller to receive an AC (alternating current) waveform and to efficiently rectify the AC waveform to provide a source of DC (direct current) power for powering the microcontroller. Since the associated high-side switch of the first output port is in the turned-off state when the voltage of the AC waveform at the first output port is lower than the voltage at the high-side DC voltage rail, unwanted discharge of the capacitance via said associated high-side switch is prevented. This means that the microcontroller can efficiently power itself from the AC waveform. This allows a microcontroller to be implemented without requiring an external source of DC power or external rectifier. Such a microcontroller could be implemented with a local source of AC power, such as may be produced by a wireless power receiver or an energy harvesting module as will be discussed in more detail later. The microcontroller can also output control signals for controlling at least one aspect of operation of a host device, i.e. a device in which the microcontroller in embedded, via at least one other output port.

In a preferred embodiment the plurality of output ports further comprises a second output port configured to receive, in use, the AC waveform and the microcontroller apparatus is configured to receive the AC waveform across the first output port and the second output port. In such an embodiment the processing module is further configured to control switching of the associated high-side switch and the associated low-side switch of the second output port based on the phase of the AC waveform so as to provide said rectified voltage, maintain the associated low-side switch of the second output port in a turned-off state when the monitored voltage of the AC waveform at the first output port is between zero and the monitored voltage at the high-side DC voltage rail, and maintain the associated low-side switch of the second output port in a turned-on state when the monitored voltage of the AC waveform at the first output port is greater than the monitored voltage at the high-side DC voltage rail. In such an embodiment the associated switches of the first and second output ports may be operated as a fully synchronous bridge rectifier. The capacitance may be electrically connected between the high-side DC voltage rail and the low-side DC voltage rail. In some instances the capacitance may be an off-chip capacitor, i.e. a capacitor which is not formed as part of an integrated circuit with the microcontroller but which is connected to voltage terminals of the microcontroller circuit. As will be discussed in more detail later such a capacitance may be expected to be present even if there were an external source of DC power.

In some implementations of the microcontroller apparatus, the capacitance may be electrically connected in series with a further capacitance between the high-side DC voltage rail and the low-side DC voltage rail, and the AC waveform may be applied between the first output port and a node between the capacitance and the further capacitance. Such an arrangement can provide rectification and voltage doubling and can be implemented using a single output port of the microcontroller.

The processing module may be configured to monitor the phase of the AC waveform by monitoring a voltage ripple on the high-side DC voltage rail. Additionally or alternatively the processing module may be configured to monitor the phase of the AC waveform by monitoring for a zero-crossing of current or voltage at a monitoring port of the microcontroller circuit, the monitoring port being configured to receive the AC waveform.

In some implementations the monitoring port may be the first output port which receives the AC waveform. The processing module may be configured to control the associated high side and low-side switches of the first output port to allow for monitoring of the first output port for a zero-crossing of the AC during a monitoring period in which a zero-crossing is expected. In such an arrangement the same output port is used for part of the AC cycle for providing rectification and for part of the AC cycle to provide monitoring of the phase of the AC waveform. During the monitoring period the processing module may be configured to monitor the voltage at the output port, and an input path may be provided from the output port, e.g. the associated switches of the output port may be tri-stated and port itself configured as an input during the monitoring phase.

In some implementations the processing module may be configured to implement a phase-locked-loop which is locked to the phase of the AC waveform to generate at least one switch control signal for controlling the high-side switch and low-side switch of the first output port.

In some implementations the high side DC voltage rail and the low-side DC voltage rail may be connected to off-chip voltage rails and used to supply power to other modules, e.g. components requiring DC power such as one or more of a sensor, actuator or communications module.

The high-side switches and low-side switches of the output ports may comprise MOSFET switches with body diodes. MOSFETs switches allow bidirectional current conduction and allow current to flow into the output port and to the DC voltage rails. The body diodes of the MOSFET switches of the first output port, and second output port if applicable, may act to provide passive rectification when the processing module is not sufficiently powered to provide active rectification control, e.g. on start-up.

The microcontroller apparatus may further comprise a power module for generating the AC waveform. The power module may be located locally to, i.e. in the vicinity of, the microcontroller. The power module may comprise at least one of a wireless power receiver and an energy harvesting module for generating an AC waveform from movement of an element of a host product.

In some instances the microcontroller apparatus may be located on, or within, a cutting element of a shaver product. For example the microcontroller may be located on, or within, the body of a cutting element. The power module may also, in some instances, be located on, or within, the body of the cutting element. The cutting element may, in some instances, be a rotary cutting element arranged to be rotated in use to provide a cutting action. The microcontroller apparatus may be configured to sense conditions at the cutting element in use and to adjust at least one aspect of operation of the shaver product in response to the sensed conditions.

Embodiments also relate to an electronic device comprising a microcontroller apparatus as described in any of the variants herein. Some embodiments relate to an electronic device in which the high-side DC voltage rail of the microcontroller is electrically connected to an external DC voltage rail configured to power at least one module external to the microcontroller. The electronic device may be a personal care product, such as shaver product, or any other type of product. A shaver product may comprise a plurality of cutting elements of the type described above and one or more of such cutting elements may comprise a microcontroller apparatus as described in any of the variants herein.

In another aspect there is provided a method of powering a microcontroller apparatus having a plurality of output ports, each output port having an associated high-side switch electrically connected between the output port and a high-side DC voltage rail and an associated low-side switch electrically connected between the output port and a low-side DC voltage rail, wherein the microcontroller apparatus further comprises a processing module and a capacitance electrically connected to the high-side DC voltage rail. The method involves controlling switching of the associated high-side switch and the associated low-side switch of at least one output port of the plurality of output ports to output a control signal for controlling at least one aspect of operation of a host device. The method further involves powering the processing module by the high-side DC voltage rail and the low-side voltage rail, receiving an AC waveform at a first output port of said plurality of output ports, and monitoring a phase of the AC waveform at the first output port, and controlling switching of the associated high-side switch and the associated low-side switch of the first output port based on the phase of the AC waveform so as to provide a rectified voltage between the high-side DC voltage rail and the low-side voltage rail. The method further involves monitoring a voltage of the AC waveform at the first output port and a voltage at the high-side DC voltage rail, maintaining the associated high-side switch of the first output port in a turned-off state when the monitored voltage of the AC waveform at the first output port is between zero and the monitored voltage at the high-side DC voltage rail, and maintaining the associated high-side switch of the first output port in a turned-on state when the monitored voltage of the AC waveform at the first output port is greater than the monitored voltage at the high-side DC voltage rail.

The method of this aspect may be implemented in any of the variants discussed herein.

Unless explicitly stated otherwise, any of the features of embodiments of the disclosure may be implemented in combination with any one or more of the other features described herein.

BRIEF DESCRIPTION OF THE DRAWINGS

To explain various features and benefits of embodiments of the present disclosure, various embodiments will be described, purely by way of example only, with respect to the accompanying drawings, of which.

DETAILED DESCRIPTION OF THE EMBODIMENTS

Various types of electronic shaver products are known. Such products typically have one or more movable cutting elements that, in use, are driven to provide a cutting action. For instance in some shaver products one or more rotatable cutting elements may be provided.

An improved or personalised user experience may be realised by sensing shaving conditions during shaving and adapting at least one aspect of the shaver operation to the sensed conditions. In some instances it may be beneficial to respond to the conditions at the cutting element, and thus it has been proposed to provide sensing and/or control at the location of the cutting element. At least some aspects of sensing and control may be provided by a microcontroller located at the location of the cutting element, for instance a microcontroller may be located on, or as part of, the structure of a rotating cutting element.

Figure 1:
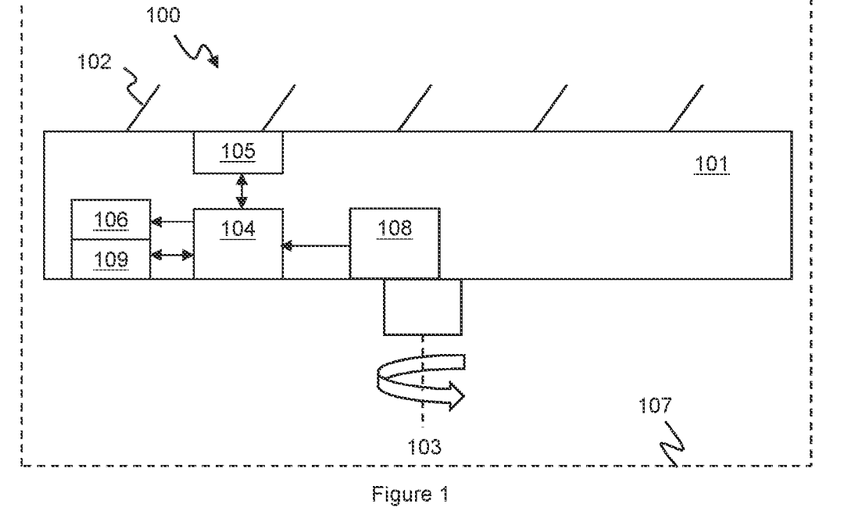
FIG. 1 shows an example of a cutting element of a shaver product having an associated microcontroller.

FIG. 1 illustrates this principle. FIG. 1 illustrates generically a cutting element 100. The cutting element has a body 101 supporting one or more cutters 102, such as blades. The cutting element is arranged so as, in use, to be rotated generally about an axis 103 to move the cutters 102 to provide a cutting action. A microcontroller 104 is co-located with the cutting element 100 and may be attached to, or formed as part of, the body 101 of the cutting element 101. As noted above microcontrollers are relatively small control circuits, typically having at least one processor and some memory and configurable to provide some sensing and/or control functionality via a variety of general purpose input-output (GPIO) ports. Microcontrollers can thus be co-located with a cutting element to provide sensing and control functionality, such as illustrated in FIG. 1. The microcontroller 104 could, for example be packaged and formed on a circuit board (not separately illustrated) which is arranged as a layer of the body 101 of the cutting element, although there are many ways in which a microcontroller could be attached to, or incorporated within, the body of a cutting element.

To provide the sensing and control functionality, the microcontroller 104 may be coupled, via suitable input ports, e.g. suitably configured GPIO ports, to one or more sensors 105 for receiving sense signals indicative of various conditions of the shaver. The microcontroller 104 may also be arranged to output control signals, via suitable output ports, e.g. suitably configured GPIO ports, to control one or more aspects of shaver operation. In some instances the microcontroller 104 may be coupled to one or more actuators 106 for adapting at least one aspect of operation of the cutting element to the sensed conditions. In some implementations the microcontroller 104 may also output control signals for operating the one or more sensors 105. In some embodiments there may be at least one communication module 109 located at the cutting element 101. The communication module 109 may be configured to receive control signals output from the microcontroller and to relay the control signals to other parts of the cutting element or other parts of the host product 107. Additionally or alternatively the communication module 109 may receive incoming control signals to be relayed to the controller, e.g. from other sensors or from a higher level control system. The microcontroller 104 will however require power to be provided to be able to operate.

When a microcontroller is located at the cutting element, such as located on a rotating cutting element body, power must be provided for the microcontroller which will rotate with the cutting element and in a way which withstand the conditions at the cutting element, e.g. resistant to water, soap, hairs etc.

Power could be derived from a power supply for the product itself. In use the cutting element will be assembled as part of a product, generally indicated as 107 in FIG. 1, and the product will have at least one source of power such as a battery and/or a mains-supply adaptor (not shown). Power could be delivered from a main power source for the product to the microcontroller 104 via some suitable supply path, i.e. via a wired connection. However as the microcontroller 104 will move, e.g. rotate, with the cutting element 101, the supply path would need to involve suitable connections between moving components, e.g. slip ring connections or the like, which would need to be suitably protected from the environment.

It may therefore be advantageous to provide the microcontroller 104 with a power module 108 capable of receiving or generating power local to the microcontroller, i.e. in the vicinity of the microcontroller, for instance co-located on the cutting element 100 with the microcontroller 104. For example the power module 108 could comprise a wireless power receiver arranged in the vicinity of the microcontroller to receive power wirelessly, for example by inductive coupling. Additionally or alternatively the power module 108 could comprise an energy harvesting module arranged to generate energy from the movement of the cutting element in use. In some arrangements the power module could be a resonant power module. As will be understood by one skilled in the art, a wireless receiver may be arranged as a resonance circuit with a resonance frequency tuned to a frequency used for power transmission. Likewise an energy harvesting module may be arranged as a resonance circuit based on a mechanical resonance of the moving components used for energy harvesting.

Both wireless power transfer and energy harvesting will generate an AC (alternating current) waveform in the power module 108. However, most microcontrollers will operate from a DC (direct current) voltage supply.

The power module 108 could be implemented with a rectifier to convert the AC waveform into suitable DC voltage for powering the microcontroller 104.

Various types of rectifier are known. One type of rectifier is a bridge rectifier that has first and second AC terminals for connecting to the AC source. The first and second AC terminals are each connected to a high-side DC terminal via respective first and second high-side arms. Likewise a low-side DC terminal is connected to the first and second AC terminals via respective first and second low-side arms. In a diode bridge rectifier, diodes are arranged in each of the arms so as to permit current flow in one direction only, e.g. from the low side DC terminal to the AC terminals and from the AC terminals to the high side DC terminal. In use, for one polarity of the AC voltage, current can flow from the first AC terminal to the high-side terminal via a diode of the first high-side arm, with a current path from the low-side DC terminal to the second AC terminal via a diode of the second low-side arm. When the polarity of the AC voltage changes, current will instead flow from the second AC terminal to the high-side DC terminal via the second high-side arm diode, with a current path from the low-side DC terminal to the first AC terminal via the first low-side arm diode. Thus whilst the polarity of current flow at the AC terminals will vary, the DC terminals will experience the same polarity of current flow throughout the cycle of the AC waveform.

A diode bridge rectifier is relatively simple and requires no active control, as the diodes of the bridge arms will automatically conduct or not based on the AC voltage. However, in use, there will be a voltage drop across the diodes which will result in some power loss or wastage associated with the rectifier. For wireless power transmission, and especially for energy harvesting, power efficiency can be important as the power available may be relatively limited, at least without using particularly expensive or bulky components.

Power loss within a bridge rectifier arrangement can be reduced by using active switches such as MOSFETs in at least some of the rectifier arms. Active switches such as MOSFETs can have a lower on-resistance than diodes and thus reduce wastage compared to diodes. In some arrangements a pair of rectifier arms, say the low side arms, could use MOSFETs rather than diodes, the MOSFETs being passively controlled by the system voltages. However there is still some power wastage via diodes in the other pair of rectifier arms, e.g. the high-side arms. In a fully synchronous bridge rectifier, active switches such as MOSFETs may be used in each of the high side and low side arms and synchronously controlled in phase with the AC waveform. This provides rectification with relatively low levels of power loss. However, the MOSFETs and associated control circuitry for monitoring the phase of the AC waveform and controlling switching of the MOSFETs will add to the size and cost associated with providing the power module 108 for microcontroller 104. In some instances there may be limited space to incorporate the microcontroller 104 and associated external circuitry, e.g. power module 108, for instance when the microcontroller is formed on or as part of a cutting element of a shaver product.

Embodiments of the disclosure relate to methods and apparatus for powering a microcontroller. In particular embodiments relate to methods and apparatus for rectifying AC power to DC power for powering a microcontroller. Embodiments of the disclosure make use of the microcontroller itself to provide rectification of an AC waveform so as to provide power for the microcontroller.

Figure 2:
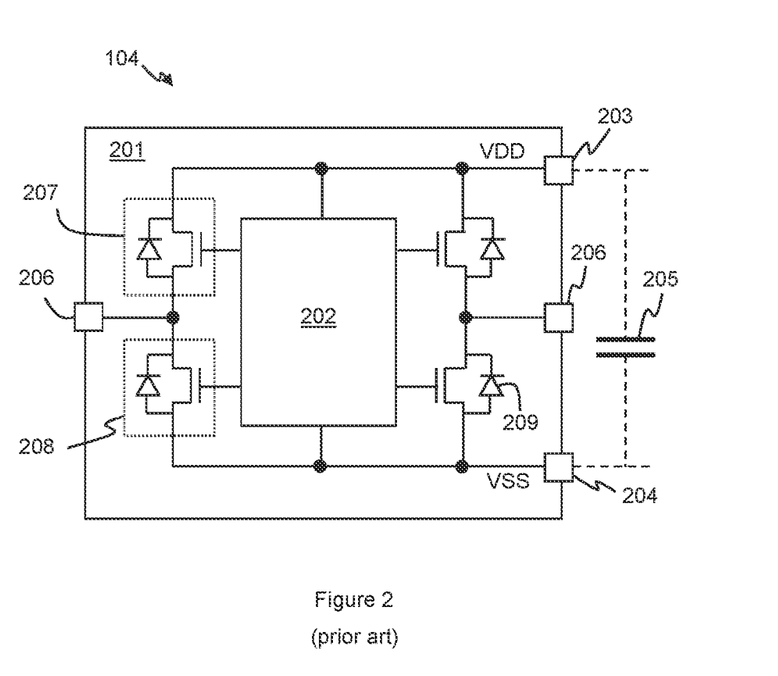
FIG. 2 illustrates an example of a conventional microcontroller circuit.

FIG. 2 illustrates generally some aspects of a standard microcontroller 104. The microcontroller is implemented as an integrated circuit 201 which comprises a processing module 202 which typically comprises a processor, memory etc. (not separately illustrated). The processing module 202 is generally powered from two DC voltage rails, a high-side supply rail VDD and a low-side supply rail VSS. Note as used herein the term high-side generally means more positive/less negative and the term low-side means less positive/more negative. In some instance the high-side supply rail could be supplied with a positive supply voltage and the low-side supply rail may be at ground. These supply voltages are generally supplied via respective supply terminals 203 and 204 from an external power source, typically via an external filter capacitance 205. The microcontroller circuit 201 also comprises at least one port 206 capable of outputting a digital output signal, i.e. an output port. FIG. 2 illustrates two such ports for clarity but it will be appreciated that there may typically be many more such ports and typically the port(s) 206 may be GPIO ports. To provide a digital output, each port 206 may be coupled to the high-side voltage rail VDD via a high side switch 207 and to the low side voltage rail VSS via low-side switch 208. Typically the switches 207 and 208 are MOSFETs and thus include a body diode 209 as would be understood by one skilled in the art. Note that as used here the term port shall be taken to refer to a terminal or connection of the microcontroller circuit, e.g. a circuit pin or pad, and the term output port shall refer to such a terminal having associated circuitry such as switches 207 and 208 such that the microcontroller could be configured to generate an output digital signal at that terminal.

The switches 207 and 208 are thus controlled by the processing module 202. To provide a logic high output state in use switch 207 may be turned-on or closed with switch 208 turned-off or open. To provide a logic low output state switch 207 may be turned-on and switch 208 turned-off. If an output port is not being used it may be disabled or tri-stated by turning-off both the high-side switch 207 and low-side switch 208.

In embodiments of the present disclosure at least one output port 206 of the microcontroller circuit 201 is coupled to receive the AC voltage and, in use the microcontroller controls the switches 207 and 208 associated with the output port to provide rectification.

Figure 3:
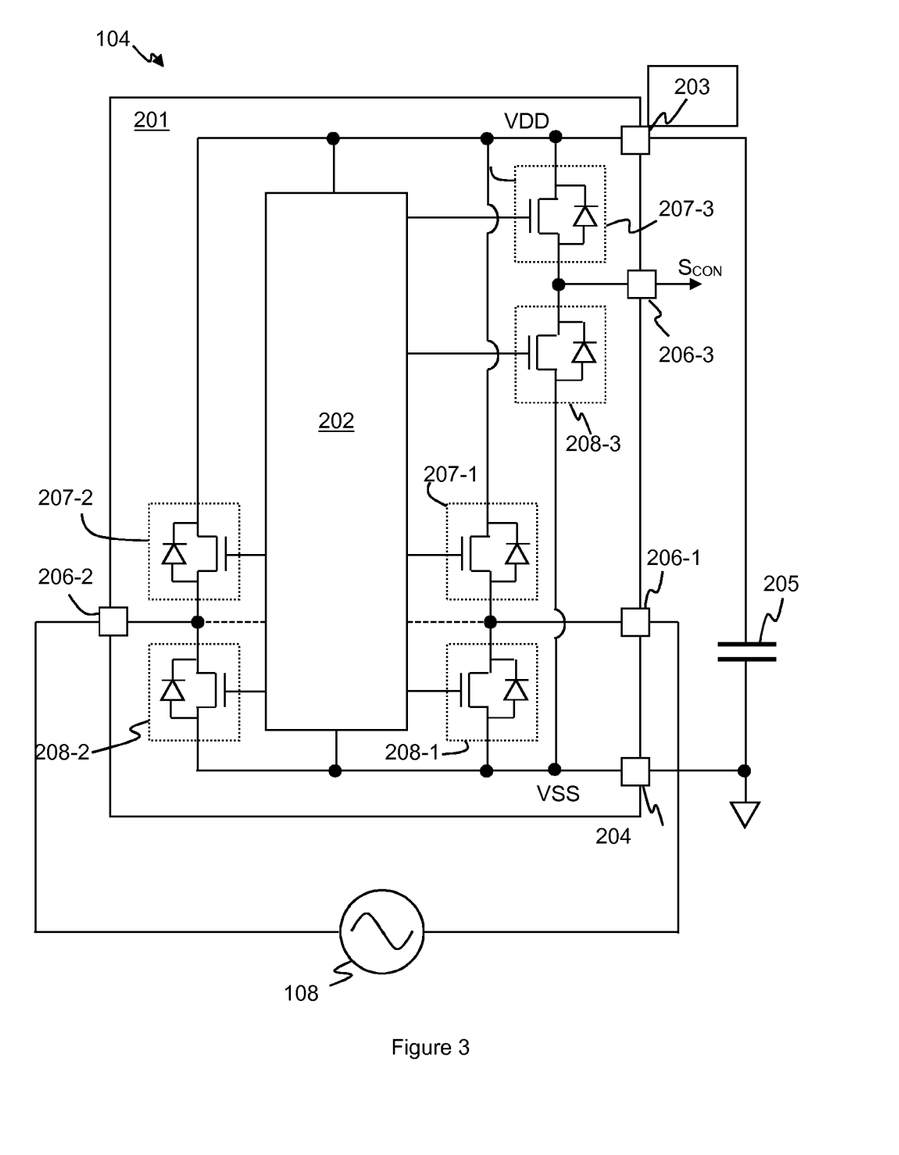
FIG. 3 illustrated an example of a microcontroller circuit arranged to provide rectification of an AC waveform according to an embodiment.

FIG. 3 illustrates a microcontroller circuit arranged to provide rectification according to one embodiment. FIG. 3 illustrates a microcontroller circuit 201 such as discussed above with respect to FIG. 2, with a plurality of output ports 206. FIG. 3 illustrates just three output ports for the purposes of explanation but it will be appreciated that there may be more output ports in some implementations. In the embodiment of FIG. 3 two of the output ports 206 (identified in FIG. 3 as first and second output ports 206-1 and 206-2 respectively) are coupled to an AC source, e.g. such as may be delivered by power module 108 without any rectification.

A capacitance 205, which typically will be an off-chip capacitor, is connected between the voltage supply terminals 203 and 204. As noted above typically an external capacitor would be connected between these terminals for filtering of the supply voltage and thus such an external capacitor 205 would be expected to be present anyway and thus does not represent any additional circuitry. In the embodiment of FIG. 3 however the high side supply terminal 203 need not be connected to any external voltage supply. In some embodiments however the high-side supply terminal and optionally the low-side supply terminal may be connected to external, i.e. off chip, voltage rails to supply power to other components.

In use the switches of the first and second output ports 206-1 and 206-2 are controlled based on the phase with the AC waveform of the AC source 108 to provide rectification. For example when, due to the applied AC waveform from AC source 108, the voltage at the first output port 206-1 is sufficiently more positive than the voltage at the second output port 206-2, the high-side switch 207-1 associated with the first output port 206-1 may be turned-on or closed to provide a current path from the first output port 206-1 to the high-side voltage rail VDD. At the same time the low-side switch 208-2 associated with the second output port 206-2 may be closed to provide a return path from the low-side voltage rail VSS to the second output port 206-2. Conversely when the voltage at the first output port 206-1 is sufficiently more negative than the voltage at the second output port 206-2, the first high-side switch 207-1 and second low-side switch 208-2 may be turned-off and the second high-sided switch 207-2 and first low-side switch 208-1 may be turned-on. This provides a current path from the second output port 206-2 to the high-side rail VDD and a return path from the low-side rail VSS to the first output port 206-1.

This means that, in use, current will flow from the AC source into one of the output ports 206. The ports of commercially available microcontrollers are able to handle both current input and current output, and readily available microcontrollers are able to handle input currents of the order of a few tens of milliamps, which is sufficient to provide power for the microcontroller. MOSFETs used as active switches of an output port are able to conduct bidirectional current. Thus a MOSFET used as a high-side switch 207 is able to allow current to flow from the output port 206 to the high-side rail VDD.

The first and second output ports 206-1 and 206-2, with their associated switches, can thus be controlled to provide synchronous rectification of the AC waveform. Thus the voltage between the DC rails, VDD and VSS, is only ever of one polarity. The capacitance 205 acts as a reservoir capacitance to store charge and to maintain the voltage of the high-side supply rail VDD and thus effectively provides some filtering to the rectified time-varying voltage developed across the DC voltage rails.

Embodiments of the present disclosure thus use the microcontroller circuit itself to provide rectification of an AC waveform so as to provide its own source of DC power. The embodiment illustrated in FIG. 3 implements a fully synchronous bridge rectifier and thus can operate with relatively low loss, thus enabling the microcontroller to be operated with a relatively low power AC source such as an energy harvesting power module or wireless power receiver. The embodiment illustrated in FIG. 3 require no additional components compared to the standard arrangement for powering a microcontroller with an external DC power source and thus does not have any increased cost or size implications, and instead just makes use of two output ports of the microcontroller.

The other output ports 206 of the microcontroller circuit 201 may be used for any suitable purpose and at least some output ports may be used to output a control signal to control at least one aspect of operation of a host device. FIG. 3 for example illustrates a further output port, i.e. third output port 206-3. The associated high-side switch 207-3 and associated low-side switch 208-3 of this third output port may be controlled by the processing module 202 so as to connect the output port to the high-side voltage rail VDD or the low-side voltage rail VSS as discussed above so as to output a control signal $S_{CON}$ to control at least one aspect of operation of a host device. For example a control signal could be output to an actuator 106 or control module 109 such as discussed above with respect to FIG. 1.

It will be appreciated that, for the microcontroller processing module 202 to control the switches of the output port, the processing module must itself be powered. On start-up, when the power module 108 starts producing an AC waveform, the microcontroller may initially be unpowered. In this unpowered state both MOSFETs 207 and 208 associated with an output port 206 would effectively be in an off-state. In this case however rectification will still occur passively via the body diode 209 of the MOSFET switches.

The configuration of the switches 207-1, 208-1, 207-2, 208-2, each with an associated body diode, provides the configuration of a diode bridge rectifier. When the AC waveform starts-up, rectification will thus occur passively, without any requirement for active control. This will, albeit with some power wastage, generate a sufficient voltage on the DC rails to enable the processing module 202 to wake-up. Once the processing module 202 is active it can start active control of the relevant switches to provide more efficient rectification.

The processing module 202 of the microcontroller circuit 201 is thus configured, in use, to operate the switches 207-1, 208-1, 207-2, 208-2 of the first and second output ports 206-1 and 206-2 to provide rectification. To provide the active rectification control, the processing module 202 will monitor the phase of the AC waveform in order to switch the switches 207-1, 208-1, 207-2, 208-2 of the first and second output ports 206-1 and 206-2 at appropriate times, e.g. when the voltage at the relevant output port is of a suitable magnitude and polarity.

There are various ways in which the phase of the AC waveform may be determined by the processing module 202. In some embodiments the processing module 202 could implement a phase-locked-loop (PLL) function. The PLL function could be implemented in software for the processing module 202. In some implementations voltage ripple on the DC supply rail, e.g. the voltage on the VDD rail, could be used as an input signal for the PLL. This voltage rail will, in use, experience a voltage ripple due to the time varying rectified version of the AC waveform. The voltage on the supply rail VDD will peak twice per AC cycle and the PLL could be synchronised to this voltage ripple to provide a clock signal at twice the frequency of the AC waveform which could be used for timing the switching of the switches of the output ports.

Additionally or alternatively at least one port of the microcontroller 201 could be connected to the AC source 108 and the relevant port(s) used as a monitoring port to detect zero-crossings of the AC waveform, i.e. when the AC current or voltage reaches zero. There will be two zero crossings per AC cycle and detecting the zero crossings provides a clear indication of the phase of the AC waveform. In some implementations a monitoring port used to monitor for zero crossings in the AC waveform could be an additional port of the microcontroller circuit 201, i.e. a port other the first or second output ports 206-1 and 206-2. However in some implementations the first and/or second output ports 206-1 and 206-2 may be used as the monitoring port(s) to monitor for zero crossings. On start-up, once the processing module 202 is sufficiently powered, but before active synchronous rectification is started, the first and second output ports 206-1 and 206-2 may be monitored by the processing module 202 to detect zero crossings of the AC waveform. The zero crossings may be detected as logic state transitions of the output port. It will be appreciated that a port such as a GPIO port can, when required, by configured as an input to provide a path (indicated by the dashed line in FIG. 3) for monitoring the voltage and/or current at the output port.

The timing of the zero crossings can be provided as an input for the PLL function implemented by the processing module 202. Once a synchronised clock signal is available this may be used to control the switches 207-1, 208-1, 207-2, 208-2 in appropriate phase with the AC waveform. However to maintain phase lock of the clock signal to the AC waveform, the synchronous rectification could be suspended, for at least some AC cycles, around the time that a zero-crossing is expected.

It will be understood that for efficient rectification a high-side switch 207 is kept turned-off until the voltage at the associated output port 206 is greater than the voltage at the high-side supply rail VDD. This means that, when the voltage at the output port 206 is lower than the voltage at the high-side voltage rail VDD, the relevant high-side switch 207 is turned-off, preventing unwanted discharge of the capacitance 205. Thus, when the magnitude of the AC voltage waveform is relatively low, both high-side switches 207-1 and 207-2 are turned-off anyway. At such a time, around a zero-crossing of the AC waveform, the associated switches of the output port 206 are turned-off and the voltage at the output port is monitored for a monitoring period. As mentioned above, during a monitoring period a zero-crossing of the AC waveform may be determined. Additionally or alternatively conduction via the body-diodes 209 of the switches may be detected and used for controlling switching of the associated switches of an output port.

Figure 4:
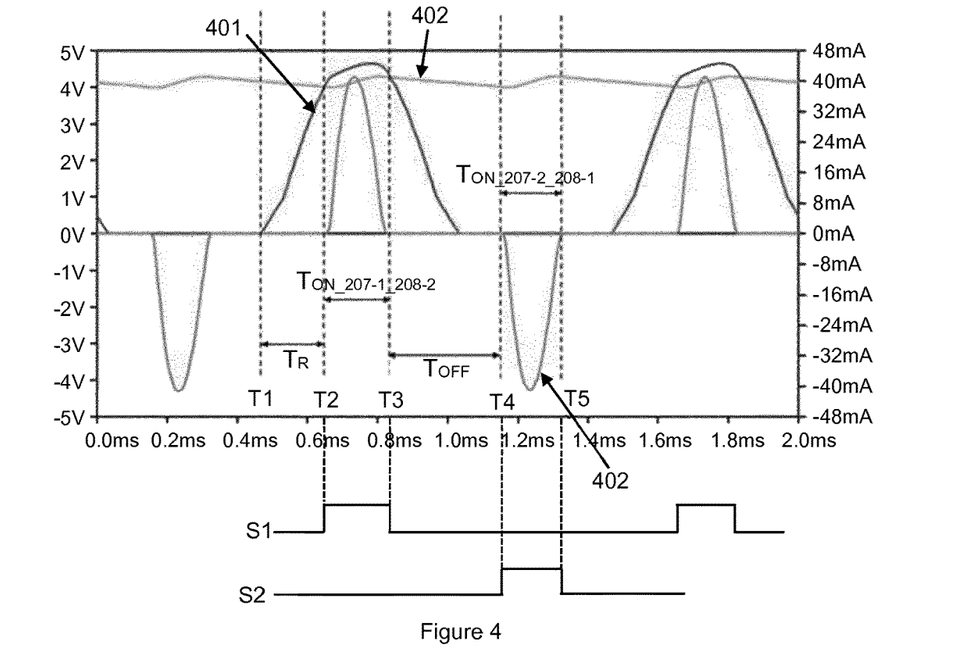
FIG. 4 illustrates one example of switching control for the microcontroller.

FIG. 4 illustrates this principle. FIG. 4 shows a plot 401 of the voltage at the first output port 206-1 over the course of an AC cycle and also the voltage 402 of the high-side DC voltage rail VDD. FIG. 4 illustrates the voltage for just the positive part of the AC cycle for clarity. At a time T1 the positive part of the AC cycle (for output port 206-1) begins when the AC waveform crosses zero. At this time the AC waveform starts rising. However until a time T2 the voltage at the output port 206-1 is lower than the high-side rail voltage VDD and thus the first high-side switch 207-1 is maintained in a turned-off state. During this period all the associated switches of the first and second output ports 206-1 and 206-2 are turned-off. In such a state the switches of the output ports 206-1 and 206-2 act as a passive rectifier, however as the voltage 402 of the high-side rail VDD is greater than the voltage at the output port 206-1 the body-diode 209 of the first high side switch 207-1 is reverse biased and there is no conduction. At a time T2 the voltage at the output port 206-1 increases to be greater than the voltage at the high-side DC voltage rail VDD and at this point the first high-side switch 201-1 is turned on. The second low-side switch is turned-on at the same time, with the two switches being controlled by a first switch control signal S1. These switches are maintained turned-on for a period $T_{ON\_207\text{-}1\_208\text{-}2}$ until a time T3 when the voltage at the output port 206-1 drops below the high side DC voltage VDD. The duration of the period $T_{ON\_207\text{-}1\_208\text{-}2}$ may be determined from the time between T1 and T2. The AC voltage waveform then drops to zero and the negative part of the cycle (for output port 206-1) begins, however this can be seen as the positive part of the AC cycle as far as the second output port 206-2 is concerned. A similar process occurs for the second output port with the second high side switch 207-2, along with the first low side switch 208-1, being turned on by a second switch control signal S2 for a period $T_{ON\_207\text{-}2\_208\text{-}1}$ between times T4 and T5 when then the voltage at the second output port 206-2 is greater than the high-side DC voltage rail VDD.

As mentioned, during the period when all switches are off ($T_{OFF}$) the relevant output port may be switched to have an input to the processing module and monitored to detect the onset of body diode conduction. The onset of body diode conduction may be detected by comparing the voltage at the relevant output port 206 with the voltage of the high-side DC voltage rail VDD.

This type of control, for monitoring zero-crossings and/or detecting body diode conduction effectively requires the ability to measure zero-crossings and generate a suitable control signal, e.g. an interrupt, at a rate which is twice the frequency of the AC waveform. The frequency of the AC waveform, and hence the period $T_{AC}$ of the AC cycle, will depend on the type of power module 108 used to provide the AC waveform. For energy harvesting the frequency of the AC waveform may depend on the type of energy harvesting used and also the rotational speed of the cutting element 101 when driven. For energy harvesting the frequency of the resultant waveform may be of the order of a several tens or hundreds of hertz to a few tens or hundreds of kilohertz, say within the range of 100 Hz to 10 kHz for some example embodiments. Such a rate of operation would be readily achievable even using relatively simple and low cost microcontrollers. For a power module having a wireless power receiver, for instance based on inductive coupling, the frequency may be of the order of a several hundreds of hertz to a few hundreds of kilohertz or higher.

A relatively simple and low cost microcontroller may be able to readily operate with AC frequencies up to say 200 kHz or so. Embodiments may also be implemented with power modules that provide a higher frequency of AC waveform, e.g. above 200 kHz, but such embodiments may require the use of microcontrollers that are specifically selected to operable at such frequencies, for instance having fast processors and/or dedicated hardware that can be used for zero-crossing detection.

The processing module 202 may, in some embodiments, monitor the voltage across the DC supply rails VDD and VSS to monitor for any over-voltage. For instance the processing module 202 may, when powered, monitor the voltage of the DC supply rail VDD against an overvoltage threshold. In the event that the overvoltage threshold is reached or exceed, the processing module 202 may generate switch control signals to turn-on both low side switches 208-1 and 208-2, with high side switches 207-1 and 207-2 turned off. This will short-circuit the AC source 108 and prevent further charging of the capacitance 205 via the body diodes of the high-side switches. Clearly this will result in a short-circuit current flowing through the low side switches 208-1 and 208-2, however especially when the power module 108 comprises a relatively low power energy harvesting system, the AC source will usually have a relatively high impedance and thus the expected current, even with the output ports 206-1 and 206-2 shorted together, may be within the tolerance of the outputs ports and associated switches.

The embodiment illustrated in FIG. 3 thus provides a means for a microcontroller to provide active rectification of an AC waveform to provide its own power source. The arrangement shown in FIG. 3 does not require any additional components compared to the conventional means of powering a microcontroller with an external DC power source and simply makes use of standard output ports, e.g. GPIO ports, of the microcontroller. A microcontroller typically has more than two configurable ports and the sensing and control functionality can be implemented using such other ports of the microcontroller. This allow a compact microcontroller to be used with a relatively compact and low power AC source, such a power module comprising an energy harvesting arrangement or a wireless power receiver.

In the arrangement illustrated in FIG. 3 the maximum voltage that could be developed between the DC voltage rails is equal to the voltage amplitude of the AC waveform, i.e. the magnitude of the peak AC voltage. In practice however the average voltage of the DC rails will be lower than this peak voltage magnitude. In some instances it may be advantageous to have a higher voltage on the DC rails.

Figure 5:
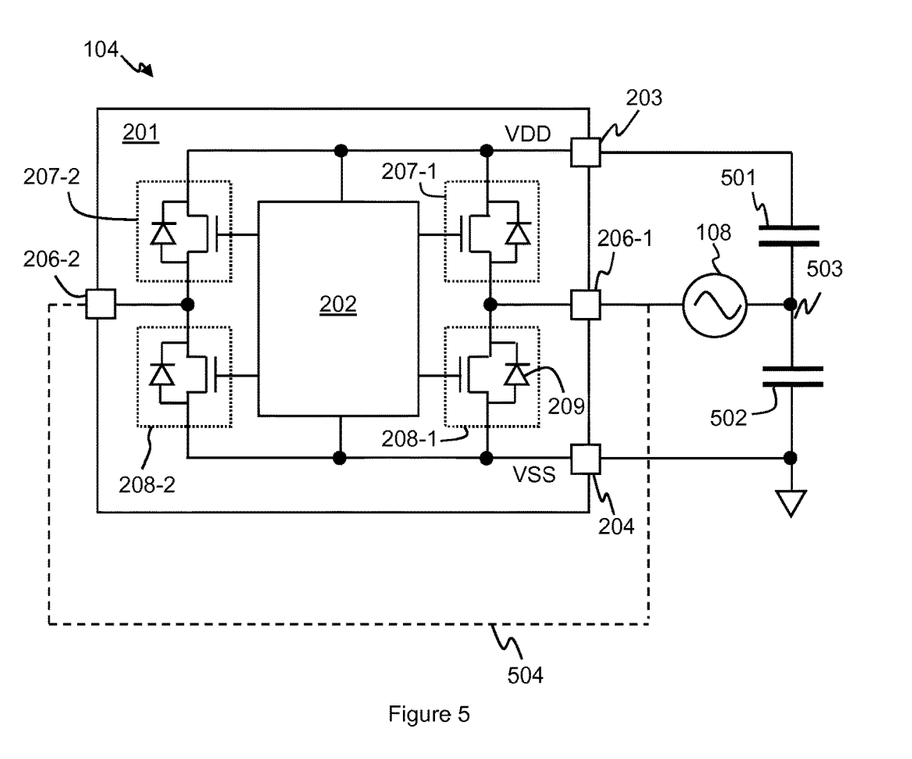
FIG. 5 illustrated an example of a microcontroller circuit arranged to provide rectification of an AC waveform according to another embodiment.

FIG. 5 illustrates another example embodiment. In the example of FIG. 5 a first output port 206-1 is coupled to one side of an AC source, such as power module 108, in a similar way as discussed with respect to FIG. 3. In this embodiment however two capacitances 501 and 502 are connected in series between the DC voltage rails VDD and VSS and the other side of the AC source 108 is connected to a node 503 between the two series connected capacitances 501 and 502. This arrangement acts as a rectifier and voltage doubler. During the positive half of the AC cycle the high-side switch 207-1 may be turned-on at an appropriate point in the cycle, with the low side switch 208-1 turned-off. This will charge capacitance 501 so that its positive plate is connected to the VDD rail. During the negative part of the AC cycle the high-side switch 207-1 may be turned-off, with the low side switch 208-1 turned-on at an appropriate point. This will charge capacitance 502 so that its positive plate is connected to node 503. The result will be that each capacitance 501 and 502 is charged, in theory to a maximum voltage equal to the magnitude of the peak AC voltage, but the voltage between the DC voltage rails VDD and VSS will be the sum of the voltages of both capacitances.

In use the phase of the AC waveform could be measured in the same way as discussed above in relation to FIG. 3, e.g. by monitoring the AC waveform at an output port, such as the first output port 206-1 if synchronous rectification was paused around the expected time of a zero-crossing, or another port of the microcontroller. The arrangement illustrated in FIG. 5 will also operate passively via the body diodes 209 of the switches 207-1 and 208-1 without active control of the switches, enabling automatic start-up when the AC waveform begins.

A further output port, 206-2, could be controlled to output a control signal to control at least one aspect of device operation.

Compared to the arrangement illustrated in FIG. 3, the embodiment of FIG. 5 provides a higher average DC voltage and can be implemented using only a single output port of the microcontroller. However it does require the use of two capacitances, for example two external capacitors, compared to the one capacitor of the FIG. 3 embodiment and thus does use additional components. However an additional external capacitor does not add much in terms of additional cost or size. It will of course be understood that any of the capacitances 205, 501 or 502 could if desired, be implemented by more than one physical capacitor.

The maximum allowed average current may also be lower for the FIG. 5 embodiment since it is carried by two MOSFET's instead of four. However in general if the required current is greater than the rated capacity of the MOSFETs associated with an output port, then two or more output ports may be connected in parallel and switched in synchronism with one another so that the current is shared between the MOSFETs of the connected ports. FIG. 5 illustrates that, if desired, a second output port 206-1 could be connected in parallel with the first output port 206-1 via path 504, in which case this output port would not be used for output of control signals, however at least a third output port could be used for outputting control signals as illustrated in FIG. 3.

In general therefore embodiments of the disclosure relate to methods and apparatus for powering microcontrollers and in particular to a microcontroller having at least a first output port coupled to an AC waveform and configured so as to control switches associated with the output port so as to provide rectification of the AC waveform at DC voltage rails for the microcontroller. The voltage generated at the DC rails can be used to power the microcontroller itself Additionally the voltage generated at the DC rails could be supplied to external, i.e. off chip, voltage rails to power other local components such as any or all of the sensor, actuator or communication module illustrated in FIG. 1 for example.

It will be understand that the accompanying figures illustrate only those aspects necessary for understanding the principles of the present disclosure and other features and components that may be present in practice have been omitted for clarity. For example FIG. 1 illustrates only generally the principles of a cutting element 100 of a shaver product 107 with a microcontroller 104 and further details of the structure of the cutting element 101, its drive mechanism and other aspects of the overall product have been omitted. Likewise FIGS. 2, 3 and 5 illustrate only some of the ports and features of a microcontroller.

The embodiments have mainly been described with reference to providing sensing and control in a shaver product. There are different conditions that it may be advantageous to sense and many different types of sensor that could be implemented and used with a microcontroller. Likewise there are many different ways in which at least some aspects of shaver operation may be adjusted based on the sensed conditions.

The embodiments have mainly been described with reference to providing sensing and control in one particular type of shaver product. It will be understood however that the principles apply to other types of shaver product, for instance other types of shaver products which may have cutting elements that do not rotate, e.g. but instead move with a generally linear reciprocating movement, and more generally to other products, whether or not for personal care. In any product where it may be advantageous to embed a microcontroller and power the microcontroller by an AC source, e.g. derived from energy harvesting or by wireless power transfer, the principles described herein can be applied and embodiments of the present disclosure extend to microcontrollers configured as discussed above for use in any product and to any product having such a microcontroller.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A microcontroller apparatus comprising:
a microcontroller circuit comprising a plurality of output ports, each output port having an associated high-side switch electrically connected between the output port and a high-side DC voltage rail (VDD) and an associated low-side switch electrically connected between the output port and a low-side DC voltage rail (VSS);

a processing module configured to be powered, in use, by the high-side DC voltage rail and the low-side DC voltage rail; and a capacitance electrically connected to the high-side DC voltage rail;

wherein at least one output port of said plurality of output ports is configured to output a control signal to control at least one aspect of operation of a host device and the processing module is configured to control switching of the associated high-side switch and low-side switch of the at least one output port so as to output said control signal;

and wherein said plurality of output ports further comprises a first output port configured to receive, in use, an AC waveform and the processing module is configured to monitor a phase of the AC waveform and to control switching of the associated high-side switch and low-side switch of the first output port based on the phase of the AC waveform so as to provide a rectified voltage between the high-side DC voltage rail and the low-side DC voltage rail;

characterized in that the processing module is configured to:

monitor a voltage of the AC waveform at the first output port and a voltage at the high-side DC voltage rail (VDD);

maintain the associated high-side switch of the first output port in a turned-off state when the monitored voltage of the AC waveform at the first output port is between zero and the monitored voltage at the high-side DC voltage rail; and maintain the associated high-side switch of the first output port in a turned-on state when the monitored voltage of the AC waveform at the first output port is greater than the monitored voltage at the high-side DC voltage rail.

2. The microcontroller apparatus as claimed in claim 1, wherein said plurality of output ports further comprises a second output port configured to receive, in use, the AC waveform, the microcontroller apparatus being configured to receive the AC waveform across said first output port and said second output port;

wherein the processing module is further configured to:

control switching of the associated high-side switch and low-side switch of the second output port based on the phase of the AC waveform so as to provide said rectified voltage;

maintain the associated low-side switch of the second output port in a turned-off state when the monitored voltage of the AC waveform at the first output port is between zero and the monitored voltage at the high-side DC voltage rail; and maintain the associated low-side switch of the second output port in a turned-on state when the monitored voltage of the AC waveform at the first output port is greater than the monitored voltage at the high-side DC voltage rail.

3. The microcontroller apparatus as claimed in claim 2, wherein the capacitance is electrically connected between the high-side DC voltage rail (VDD) and the low-side DC voltage rail (VSS).

4. The microcontroller apparatus as claimed in claim 1, wherein the capacitance is electrically connected in series with a further capacitance between the high-side DC voltage rail (VDD) and the low-side DC voltage rail (VSS), wherein the AC waveform is applied between the first output port and a node between the capacitance and the further capacitance.

5. The microcontroller apparatus as claimed in claim 1, wherein the processing module is configured to monitor the phase of the AC waveform by monitoring a voltage ripple on the high-side DC voltage rail (VDD).

6. The microcontroller apparatus as claimed in claim 1, wherein the processing module is configured to monitor the phase of the AC waveform by monitoring for a zero-crossing of current or voltage at a monitoring port of the microcontroller apparatus, the monitoring port being configured to receive the AC waveform.

7. The microcontroller apparatus as claimed in claim 6, wherein the monitoring port is said first output port and wherein the processing module is configured to control the associated high side switch and the low-side switch of the first output port to allow for monitoring of the first output port for a zero-crossing of the AC waveform during a monitoring period in which a zero-crossing is expected.

8. The microcontroller apparatus as claimed in a claim 1, wherein the processing module is configured to implement a phase-locked-loop which is locked to the phase of the AC waveform to generate at least one switch control signal for controlling the associated high-side switch and low-side switch of the first output port.

9. The microcontroller apparatus as claimed in a claim 1, wherein said high-side switches and said low-side switches comprise MOSFET switches with body diodes.

10. The microcontroller apparatus as claimed in a claim 1, further comprising a power module for generating said AC waveform, wherein said power module comprises at least one of a wireless power receiver and an energy harvesting module for generating an AC waveform from movement of an element of a host product.

11. An electronic device comprising a microcontroller apparatus as claimed in claim 1.

12. The electronic device as claimed in claim 11, wherein the high-side DC voltage rail (VDD) of the microcontroller apparatus is electrically connected to an external DC voltage rail configured to power at least one module external to the microcontroller apparatus.

13. A shaver product comprising at least one microcontroller apparatus as claimed in claim 1, wherein the microcontroller apparatus is located on or within a cutting element of the shaver product.

14. The shaver product as claimed in claim 13, wherein the microcontroller apparatus is configured to sense conditions at the cutting element in use and to adjust at least one aspect of operation of the shaver product in response to the sensed conditions.

15. A method of powering a microcontroller apparatus having a plurality of output ports, each output port having an associated high-side switch electrically connected between the output port and a high-side DC voltage rail (VDD) and an associated low-side switch electrically connected between the output port and a low-side DC voltage rail (VSS), wherein the microcontroller apparatus further comprises a processing module and a capacitance electrically connected to the high-side DC voltage rail, the method comprising:

controlling switching of the associated high-side switch and the associated low-side switch of at least one output port of said plurality of output ports to output a control signal for controlling at least one aspect of operation of a host device;

powering the processing module by the high-side DC voltage rail and the low-side voltage rail;

receiving an AC waveform at a first output port of said plurality of output ports;

monitoring a phase of the AC waveform at the first output port; and controlling switching of the associated high-side switch and the associated low-side switch of the first output port based on the phase of the AC waveform so as to provide a rectified voltage between the high-side DC voltage rail and the low-side voltage rail;

characterized in that the method further comprises:

monitoring a voltage of the AC waveform at the first output port and a voltage at the high-side DC voltage rail (VDD);

maintaining the associated high-side switch of the first output port in a turned-off state when the monitored voltage of the AC waveform at the first output port is between zero and the monitored voltage at the high-side DC voltage rail; and maintaining the associated high-side switch of the first output port in a turned-on state when the monitored voltage of the AC waveform at the first output port is greater than the monitored voltage at the high-side DC voltage rail.

* * * * *